United States Patent
Chan et al.

(10) Patent No.: US 7,272,030 B2
(45) Date of Patent: Sep. 18, 2007

(54) GLOBAL BIT LINE RESTORE TIMING SCHEME AND CIRCUIT

(75) Inventors: Yuen H. Chan, Poughkeepsie, NY (US); Ryan T. Freese, Poughkeepsie, NY (US); Antonio R. Pelella, Highland Falls, NY (US); Uma Srinivasan, Poughkeepsie, NY (US); Arthur D. Tuminaro, LaGrangeville, NY (US); Jatinder K. Wadhwa, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/554,072

(22) Filed: Oct. 30, 2006

(65) Prior Publication Data

US 2007/0058421 A1   Mar. 15, 2007

Related U.S. Application Data

(62) Division of application No. 11/054,479, filed on Feb. 9, 2005, now Pat. No. 7,170,774.

(51) Int. Cl.
*G11C 11/00* (2006.01)

(52) U.S. Cl. .................... 365/154; 365/203
(58) Field of Classification Search .......... 365/154, 365/203, 156, 189.08
See application file for complete search history.

(56) References Cited

U.S. PATENT DOCUMENTS

| 5,777,935 A | 7/1998 | Pantelakis et al. ......... 365/203 |
| 6,512,712 B1 | 1/2003 | Desai et al. ............... 365/203 |
| 6,930,902 B2 | 8/2005 | Mayer et al. .............. 365/63 |
| 7,075,855 B1* | 7/2006 | Bunce et al. .............. 365/233 |

* cited by examiner

*Primary Examiner*—Anh Phung
(74) *Attorney, Agent, or Firm*—Lynn L. Augspurger

(57) ABSTRACT

A domino SRAM array restore pulse generation system launches the work decode line by the same local clock as the restore pulse, thus eliminating any race issues with the word line select. This system allows the global bit select (or column select) to have fast activation by releasing the reset signal (with the earliest arriving array clock, ck1), while guaranteeing almost perfect tracking with the bit decode system. This allows for the widest possible write window; earliest release of the pre-charge in the global column select, and resetting only after the bit decode system is deactivated.

12 Claims, 2 Drawing Sheets

GLOBAL BIT LINE RESTORE CIRCUIT

GLOBAL BIT LINE RESTORE CIRCUIT

TIMING DIAGRAM OF THE GLOBAL BIT LINE RESTORE CIRCUIT

GLOBAL BIT LINE RESTORE TIMING SCHEME AND CIRCUIT

CROSS REFERENCE TO RELATED APPLICATIONS

This application is a division of U.S. patent application Ser. No. 11/054,479 "Global Bit Line Restore Timing Scheme and Circuit", Chan et al., filed Feb. 9, 2005, now U.S. Pat. No. 7,170,774, issued on Jan. 30, 2007. This application contains subject matter that is related to the subject matter of the following co-pending applications, each of which is assigned to the same assignee as this application, International Business Machines Corporation of Armonk, N.Y., and is filed concurrently herewith. Each of the below listed applications is hereby incorporated herein by reference.

High Speed Domino Bit Line Interface Early Read and Noise Suppression, U.S. Ser. No. 11/054,296 filed Feb. 9, 2005; Global Bit Select Circuit With Dual Read and Write Bit Line Pairs, U.S. Ser. No. 11/054,309 filed Feb. 9, 2005; Local Bit Select Circuit With Slow Read Recovery Scheme, filed Feb. 9, 2005, now U.S. Pat. No. 7,102,946 issued Sep. 5, 2006; Local Bit Select With Suppression, filed February 2005, now U.S. Pat. No. 7,113,433 issued Sep. 26, 2006.

BACKGROUND OF THE INVENTION

1. Field of the Invention

This invention relates to domino Static Random Access Memory (SRAM), and more particularly to an improved system for aligning the timing of the restore pulse on the local bit line pair with the timing of word and bit decode lines.

2. Description of Background

A static semiconductor memory typically includes six-transistor cell in which four transistors are configured as a cross-coupled latch for storing data. The remaining two transistors are used to obtain access to the memory cell. During a read access, differential data stored in the memory cell is transferred to the attached bit line pair. A sense amplifier senses the differential voltage that develops across the bit line pair. During a write access, data is written into the memory cell through the differential bit line pair. Typically, one side of the bit line pair is driven to a logic low level potential and the other side is driven to a high voltage level. The cells are arranged in an array that has a grid formed of bit lines and word lines, with the memory cells disposed at intersections of the bit lines and the word lines. The bit lines and the word lines are selectively asserted or negated to enable at least one cell to be read or written to.

As will be appreciated by those skilled in the art, in prior art domino SRAM design the cells are arranged into groups of cells, typically on the order of eight to sixteen cells per group. Each cell in a group is connected to a local bit line pair. The local bit line pair for each group of cells is coupled to a global bit line pair. Rather than use sense amplifier to detect a differential voltage when reading a cell, in a domino SRAM the local bit lines are pre-charged and discharged by the cell in a read operation, which discharge is detected and determines the state of the cell. The local bit line, the pre-charge means, and the detection means define a dynamic node of the domino SRAM. Domino SRAM of the type discussed here are explained in greater detail in U.S. Pat. Nos. 5,729,501, 6,058,065 and 6,657,886, which are incorporated herein by reference.

In domino SRAM array designs, the read or write operation is performed by initially pre-charging the bit lines and, after pre-charging, true and complement data is made available on the bit lines. In this scheme, the restore pulse to pre-charge the bit lines has to be very carefully aligned with the timing of the state of the word and bit decode lines in order to avoid a collision. The bit line restore pulse in a typical prior art design is generated by the local array clock signal. It does not have the same circuit delay as those in the word and bit decode paths. It is therefore difficult to line up the bit line restore pulse with the bit decode and word decode outputs to provide for a well synchronized operation.

SUMMARY OF THE INVENTION

An object of this invention is the provision of a domino SRAM array restore pulse generation system which ensures that the restore pulse to pre-charge the bit lines occurs after the bit decode signal has ended thereby eliminating any chance for a collision or race condition.

Another object of this invention is the provision of a domino SRAM array restore pulse generation system that is complete by the end of one read or write cycle, so that a read or write operation can start early in the next read or write cycle.

Briefly, this invention contemplates the provision of a domino SRAM array restore pulse generation system in which the word decode lines are launched by the same local clock as the restore pulse, thus eliminating any race issues with the word line select. This system allows the global bit select (or column select) to have fast activation by releasing the reset signal (with the earliest arriving local array clock, ck1), while guaranteeing almost perfect tracking with the bit decode system. This allows for the widest possible write window; earliest release of the pre-charge in the global column select, and resetting only after the bit decode system is deactivated.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
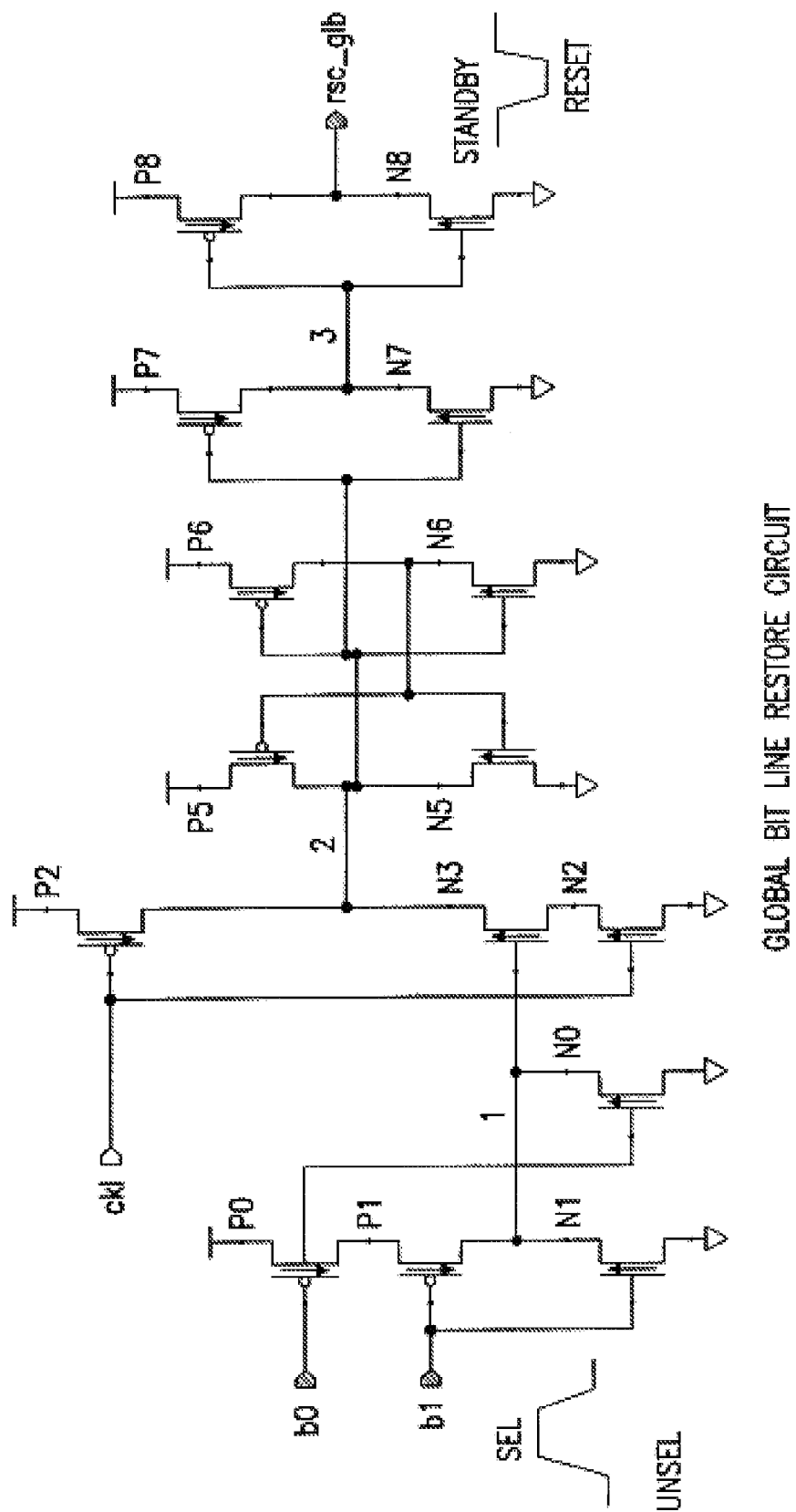
FIG. 1 is a schematic drawing of one specific embodiment of a global bit line restore circuit in accordance with the teachings of this invention.
Figure 2:
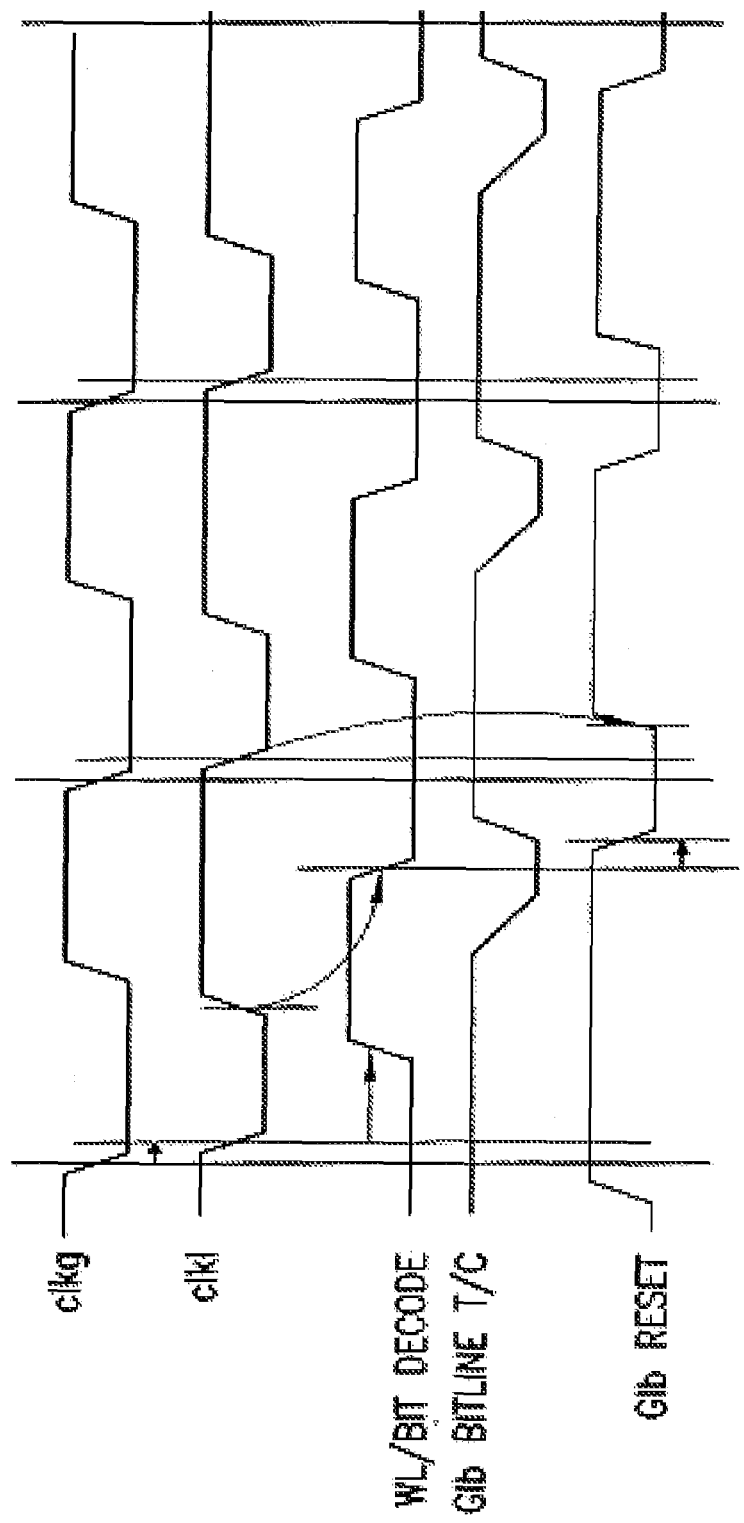
FIG. 2 is a timing diagram for the circuit shown in FIG. 1

Referring now to FIGS. 1 and 2 of the drawings, b0 and b1 are the bit decode signal lines for a 1-out-of-2 bit decode system. For a 1-out-of-4 bit decode, there will be 4 decode lines b0-b3. The bit decode outputs, also referred to as Global-Column-Select in the above referenced copending patent applications, are fed to the global bit select circuits to perform the column select function. They should not be confused with the global bit lines, which are the read and write bit line pairs in the global bit select circuits. The ck1 is the active low local array clock signal that enables the bit and word select lines. In standby mode, ck1 is high, turning on nfet transistor N2. The bit decode lines b0 and b1 are low, and node 1 is pulled up, turning on transistor N3. This pulls down node 2, thus giving a 'low' at global bit line restore output rsc_glb, which restores the global bit lines from the global bit select circuits. In active mode, at the beginning of a read or write cycle, the ck1 goes low, this pulls up node 2, producing a 'high' on rsc_glb, thus shutting off the global bit lines restoring PFETs. This relieves the global bit lines, allowing them to be switched to perform a read or write operation. When ck1 goes low, it also triggers the word and bit path decode circuitry. A selected word line and a selected bit decode line (either b0, or b1 in this illustration) will go high. A high input at b0 or b1 will pull down on node 1, hence shutting off N3 and setting the stage for the next signal switching. At the end of a read or write operation, ck1 goes back high again to a standby mode, turning on N2 transistor again. The active bit decode signal (b0 or b1) also goes low to its unselected state, pulling node 1 high to turn on N3. With N2 and N3 both turned on, mode 2 is pull down again, driving the restore output rsc_glb to a low level to trigger the global bit line restore operation. The latch comprised of transistors P5/N5, and P6/N6 holds the value on node 2 for the duration of an active mode. When either b0 or b1 is still high (indicating a selected bit decode) it pulls down the node 1, thus turning off transistor N3. When ck1 goes high near the end of a read/write cycle and before b0 or b1 is switched low to its unselected state, node 2 is held high by the latch. This prevents node 2 from going low or floating and thus the output rec_glb is guaranteed to be in its non-reset mode. This circuit design thus avoids a race condition during restore of the bit lines.

The timing diagram in FIG. 2 describes the operation of the global bit line restore scheme. Global clock signal clkg generates a low active local clock signal, clk1, (also referred to as ck1 in FIG. 1) via an array local clock generator (not shown). The falling edge of clk1 triggers the word and bit path circuitry so that the selected word line (wl) and bit decode line are turned ON to perform a read or write operation. The global bit line (either true or complement) is pulled down (one side being pulled down, while the other side stays high, depending on the data) in response to a read or write operation. At the end of a read/write operation, the bit line restore signal Glb Reset (active low) is triggered to its low state by the rising clk1 and falling bit decode. This starts the restore operation and pulls up the global bit lines to standby mode and be ready for the next read cycle or write cycle operation. The restore ends when Glb Reset signal is pulled up by the falling clk1 at beginning of the next cycle. This design, thus ensures that restore is complete before word and bit decodes become active.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A circuit for generating a global bit line restore signal in a domino SRAM comprising in combination:
    a word line decode input and a bit line decode input for receiving decode signals having a select state and an unselect state;
    a local array clock input for receiving a local array clock signal having an active state and a standby state;
    a global bit line restore signal output; and
    a logic circuit connected to said word line decode input, said bit line decode input terminal, and said local array cock input, said logic circuit generating an active global bit line restore signal at said global bit line restore signal output in response to the local array clock signal in its standby state and the decode signals in their unselected state.

2. A circuit for generating a global bit line restore signal in a domino SRAM as in claim 1 wherein said logic circuit terminates said active global bit line restore signal in response to said local array clock signal switching to its active state.

3. A circuit for generating a global bit line restore signal in a domino SRAM as in claim 1 wherein said logic circuit holds said global bit line restore signal in a standby state when said decode signals are in their select state.

4. A circuit for generating a global bit line restore signal in a domino SRAM as in claim 1 wherein a global clock signal generates said local array clock signal.

5. A circuit for generating a global bit line restore signal in a domino SRAM as in claim 2 wherein said logic circuit holds said global bit line restore signal in a standby state when said decode signals are in their select state.

6. A circuit for generating a global bit line restore signal in a domino SRAM as in claim 2 wherein a global clock signal generates said local array clock signal.

7. A circuit for generating a global bit line restore signal in a domino SRAM as in claim 3 wherein a global clock signal generates said local array clock signal.

8. A circuit for generating a global bit line restore signal in a domino SRAM as in claim 5 wherein a global clock signal generates said local array clock signal.

9. A system for generating a global bit line restore signal in a domino SRAM comprising in combination:
    means for receiving a word line decode input signal and a bit line decode input signal each having a select state and an unselect state;
    means for receiving a local array clock signal having an active state and a standby state; and
    means for generating an active global bit line restore signal in response to the local array clock signal in its standby state and the decode signals in their unselect state.

10. A system for generating a global bit line restore signal in a domino SRAM as in claim 9 wherein said means for generating terminates said active global bit line restore signal in response to said local array clock signal switching to its active state.

11. A system for generating a global bit line restore signal in a domino SRAM as in claim 10 wherein said means for generating holds said global bit line restore signal in a standby state when said decode signals are in their select state.

12. A system for generating a global bit line restore signal in a domino SRAM as in claim 11 wherein said means for generating holds said global bit line restore signal in a standby state when said decode signals are in their select state.

* * * * *